(12) United States Patent  
Won et al.

(10) Patent No.: US 7,833,885 B2
(45) Date of Patent: Nov. 16, 2010

(54) MICROCRYSTALLINE SILICON THIN FILM TRANSISTOR

(75) Inventors: Tae Kyung Won, Suwon (KR); Soo Young Choi, Fremont, CA (US); Dong Kil Yim, Sungnam (KR); Jriyan Jerry Chen, Santa Clara, CA (US); Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

(21) Appl. No.: 12/323,872

(22) Filed: Nov. 26, 2008

(65) Prior Publication Data

US 2009/0200552 A1 Aug. 13, 2009

Related U.S. Application Data

(63) Continuation-in-part of application No. 12/204,563, filed on Sep. 4, 2008.

(60) Provisional application No. 61/027,809, filed on Feb. 11, 2008, provisional application No. 61/080,624, filed on Jul. 14, 2008.

(51) Int. Cl.
*H01L 21/00* (2006.01)
(52) U.S. Cl. .................. 438/482; 438/485; 257/67; 257/E21.102; 257/E21.104
(58) Field of Classification Search ................ 438/482, 438/485; 257/67, E21.102, E21.104
See application file for complete search history.

(56) References Cited

U.S. PATENT DOCUMENTS

| | | | |
|---|---|---|---|
| 5,294,811 | A | 3/1994 | Aoyama et al. |
| 5,942,050 | A | 8/1999 | Green et al. |
| 6,190,932 | B1 | 2/2001 | Yoshimi et al. |
| 6,200,825 | B1 | 3/2001 | Yoshimi et al. |
| 6,265,288 | B1 | 7/2001 | Okamoto et al. |
| 6,297,443 | B1 | 10/2001 | Nakajima et al. |

(Continued)

FOREIGN PATENT DOCUMENTS

EP  0 994 515 A2  4/2000

(Continued)

OTHER PUBLICATIONS

International Search Report and Written Opinion of PCT/US07/71703, dated Dec. 6, 2007.

(Continued)

*Primary Examiner*—Trung Dang
(74) *Attorney, Agent, or Firm*—Patterson & Sheridan, LLP

(57) ABSTRACT

Methods for forming a microcrystalline silicon layer in a thin film transistor structure are provided. In one embodiment, a method for forming a microcrystalline silicon layer includes providing a substrate in a processing chamber, supplying a gas mixture having a hydrogen-based gas, a silicon-based gas and an argon gas into the processing chamber, the gas mixture having a volumetric flow ratio of the hydrogen-based gas to the silicon-based gas greater than about 100:1, wherein a volumetric flow ratio of the argon gas to the total combined flow of hydrogen-based gas and the silicon-based gas is between about 5 percent and about 40 percent, and maintaining a process pressure of the gas mixture within the processing chamber at greater than about 3 Torr while depositing a microcrystalline silicon layer on the substrate.

20 Claims, 5 Drawing Sheets

U.S. PATENT DOCUMENTS

| | | |
|---|---|---|
| 6,309,906 B1 | 10/2001 | Meier et al. |
| 6,326,304 B1 | 12/2001 | Yoshimi et al. |
| 6,337,224 B1 | 1/2002 | Okamoto et al. |
| 6,566,159 B2 | 5/2003 | Sawada et al. |
| 6,989,553 B2 | 1/2006 | Yokogawa et al. |
| 7,074,641 B2 | 7/2006 | Kondo et al. |
| 7,314,526 B1 | 1/2008 | Preti et al. |
| 2002/0033191 A1 | 3/2002 | Kondo et al. |
| 2004/0082097 A1 | 4/2004 | Lohmeyer et al. |
| 2004/0238851 A1 | 12/2004 | Flores et al. |
| 2005/0251990 A1 | 11/2005 | Choi et al. |
| 2006/0060138 A1 | 3/2006 | Keller et al. |
| 2006/0240630 A1 | 10/2006 | Bauer et al. |
| 2007/0039942 A1 | 2/2007 | Leung et al. |
| 2007/0298590 A1 | 12/2007 | Choi et al. |
| 2008/0035306 A1* | 2/2008 | White et al. .................. 165/61 |
| 2008/0245414 A1* | 10/2008 | Sheng et al. ................ 136/261 |
| 2009/0029530 A1* | 1/2009 | Kunii ......................... 438/478 |
| 2009/0242889 A1* | 10/2009 | Nakayama ................... 257/59 |

FOREIGN PATENT DOCUMENTS

| | | |
|---|---|---|
| JP | 2007-262541 A | 10/2007 |
| KR | 2006-0077554 A | 7/2006 |

OTHER PUBLICATIONS

O. Vetterl, et al "Preparation Temperature Effects in Microcrystalline Silicon Thin Film Solar Cells", Mat. Res Soc. Symp. Proc. vol. 664 p. A 25.8.1-A 25.8.6, 2001.

Stefan Klein, et al "Microcrystaline Silicon Prepared by Hot-Wire Chemical Vapor Deposition for Thin Film Solar Cell Applications", Jpn J. Appl. Phys. vol. 41(2002)pp. L 10-12, Jan. 2002.

S. Klein, et al "High Efficiency Thin Film Solar Cells with Intrinsic Microcrystaline Silicon Prepared by Hot Wire CVD" Mat. Res. Soc. Symp. Proc. vol. 715 @ 2002 Materials Research Society, pp. A.26.2.1-A 26.2.6.

Ujjwal K. Das et al "Amorphous and Microcrystaline silicon Solar Cells Grown by Pulsed PECVD Technique", Mat. Res. Soc. Symp. Proc. vol. 715 @ 2002 Materials Research Society pp. A. 26.6. 1-A 26.6.6.

PCT International Search Report and Written Opinion of PCT/US2009/030865, dated Jun. 29, 2009.

* cited by examiner

US 7,833,885 B2

MICROCRYSTALLINE SILICON THIN FILM TRANSISTOR

CROSS-REFERENCE TO RELATED APPLICATIONS

This application is a continuation-in-part of U.S. patent application Ser. No. 12/204,563, entitled "Microcrystalline Silicon Thin Film Transistor", filed Sep. 4, 2008, which benefit of U.S. Provisional Application Ser. No. 61/027,809 filed Feb. 11, 2008 and U.S. Provisional Application Ser. No. 61/080,624, filed Jul. 14, 2008, all of which are incorporated by reference in their entireties.

BACKGROUND OF THE INVENTION

1. Field of the Invention

Embodiments of the present invention generally relate to methods for forming a microcrystalline silicon film. More particularly, this invention relates to methods for forming a microcrystalline silicon film in thin film transistors devices.

2. Description of the Related Art

Plasma display panels and liquid crystal displays are frequently used for flat panel displays. Liquid crystal displays (LCD) generally contain two glass substrates joined together with a layer of a liquid crystal material sandwiched therebetween. The glass substrate may be a semiconductor substrate, or may be a transparent substrate such as a glass, quartz, sapphire, or a clear plastic film. The LCD may also contain light emitting diodes for back lighting.

As the resolution requirements for liquid crystal displays increase, it has become desirable to control a large number of separate areas of the liquid crystal cell, called pixels. In a modern display panel, more than 1,000,000 pixels may be present. At least the same number of transistors is formed on the glass substrate so that each pixel can be switched between an energized and de-energized state relative to the other pixels disposed on the substrate.

FIG. 1 depicts a conventional thin film transistor device 100 disposed on a substrate 102. A dielectric layer 104 may be optionally disposed on the substrate 102. Subsequently, a gate electrode 106 is formed and patterned on the dielectric layer 104 followed by a gate insulator layer 108. A semiconductor layer of amorphous silicon (a-Si) 110 is usually formed on the gate insulator layer 108 followed by a thin doped semiconductor layer of n-type or p-type amorphous silicon layer ($N^+/P^+$-a-Si) 112. After formation of the doped semiconductor layer 112, a source-drain metal electrode layer 114 is then disposed thereon to form the thin film transistor device 100. Since electron mobility in the transistors dominates device performance, greater mobility of electrons in transistors or devices is often desired. A electronic device with high electron mobility would allow more pixel area for light transmission and integration of circuitry, thereby allowing brighter display, higher overall electrical efficiency, faster response time and higher resolution displays. The limited electron mobility inherent to conventionally processed amorphous silicon device results in limited frame refresh rates and pixel densities. Moreover, a stable and reliable operation of electronic devices with lower threshold voltage shift also prevail the overall performance of the electronic devices.

Therefore, there is a need for devices having improved electron mobility and stability and a method for manufacturing the same.

SUMMARY OF THE INVENTION

Embodiments of the disclosure generally provide methods of forming microcrystalline thin film transistor devices providing high electron mobility and stable device performance. In one embodiment, a method for forming a microcrystalline silicon layer includes providing a substrate in a processing chamber, supplying a gas mixture having a hydrogen-based gas, a silicon-based gas and an argon gas into the processing chamber, the gas mixture having a volumetric flow ratio of the hydrogen-based gas to the silicon-based gas greater than about 100:1, wherein a volumetric flow ratio of the argon gas to the total combined flow of hydrogen-based gas and the silicon-based gas is between about 5 percent and about 40 percent, and maintaining a process pressure of the gas mixture within the processing chamber at greater than about 3 Torr while depositing a microcrystalline silicon layer on the substrate.

In another embodiment, a method for forming a microcrystalline silicon containing layer on a substrate includes providing a substrate in a processing chamber, supplying a gas mixture having a $H_2$ gas, a $SiH_4$ gas and an Ar gas into the processing chamber, wherein the $H_2$ gas to $SiH_4$ gas having a volumetric flow ratio of greater than about 100:1, wherein volumetric flow ratio of the argon gas to the total combined flow of $H_2$ gas and the $SiH_4$ gas is between about 5 percent and about 40 percent, and maintaining a process pressure of the gas mixture within the processing chamber at greater than about 3 Torr while depositing a microcrystalline silicon layer.

In yet another embodiment, a thin film transistor structure includes a gate insulator layer disposed on a substrate, a microcrystalline silicon layer disposed over the gate insulator layer, wherein the microcrystalline silicon layer is formed by supplying a gas mixture comprising a $H_2$ gas, $SiH_4$ gas and an argon gas, wherein a volumetric flow ratio of the Ar gas to the total combined flow of $H_2$ gas and the $SiH_4$ gas is controlled at between about 5 percent and about 40 percent, and a doped semiconductor amorphous silicon layer disposed over the microcrystalline silicon layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure provide methods of forming a microcrystalline silicon layer. The microcrystalline silicon layer may be used in a TFT device. The microcrystalline silicon layer may also be used in photodiodes, semiconductor diode, light-emitting diode (LED), or organic light-emitting diode (OLED), or other suitable display applications. The microcrystalline silicon layer provides high electron mobility and stability and low film leakage, thereby efficiently enhancing the electrical performance of transistor and diode devices. It is noted that the microcrystalline silicon layer may be used in other suitable devices beyond the application noted above.

Figure 2:
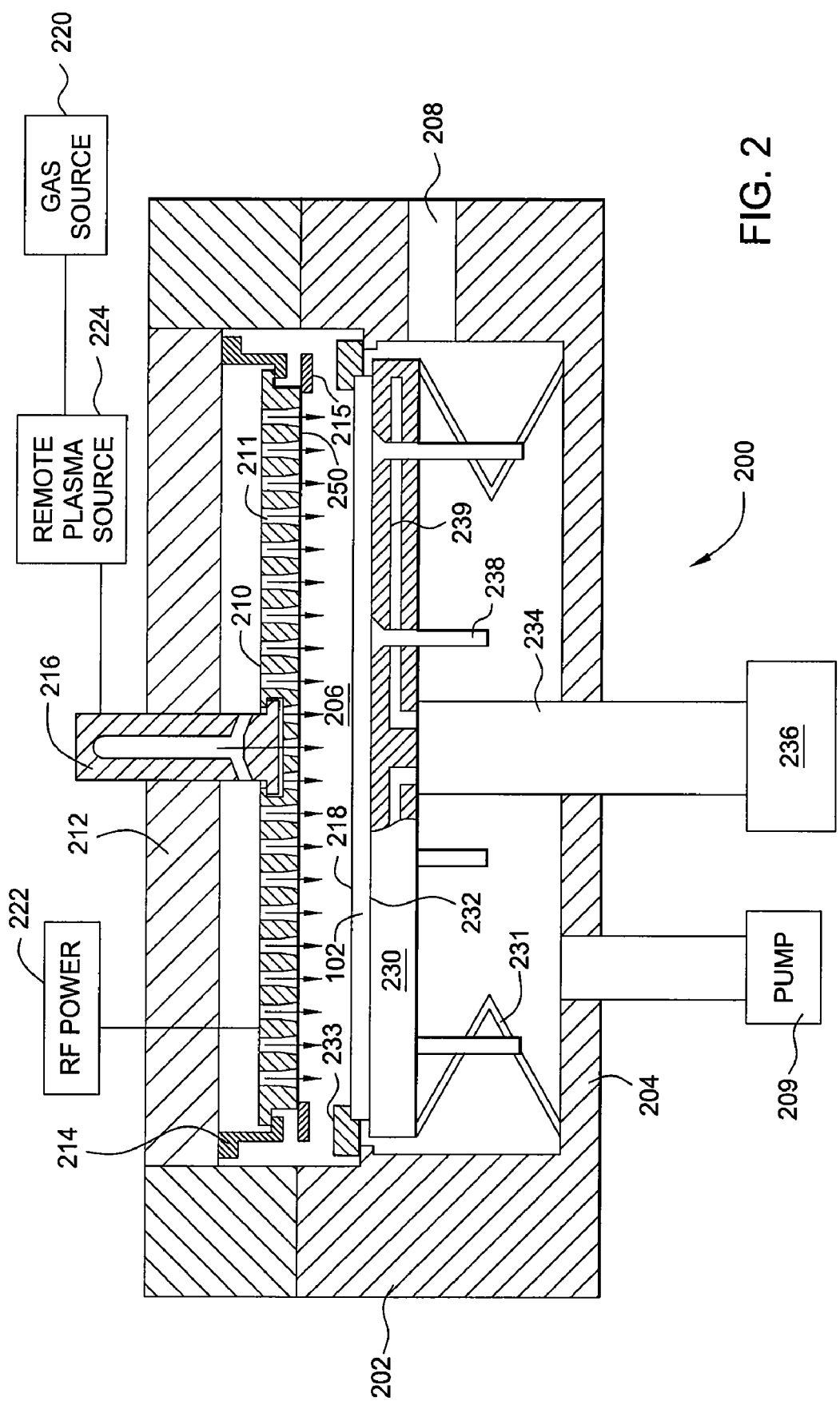
FIG. 2 depicts a sectional view of the processing chamber that may be used to deposit a microcrystalline silicon layer in accordance with one embodiment of the present invention.

FIG. 2 is a schematic cross-section view of one embodiment of a plasma enhanced chemical vapor deposition (PECVD) chamber 200 in which a microcrystalline silicon layer or other silicon containing layer may be formed therefrom. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 200 generally includes walls 202, a bottom 204 and a lid 212 which bound a process volume 206. A gas distribution plate 210 and substrate support assembly 230 which define a process volume 206. The process volume 206 is accessed through a valve 208 formed through the wall 202 such that a substrate 102 may be transferred in to and out of the chamber 200.

The substrate support assembly 230 includes a substrate receiving surface 232 for supporting the substrate 102 thereon. A stem 234 couples the substrate support assembly 230 to a lift system 236 which raises and lowers the substrate support assembly 230 between substrate transfer and processing positions. A shadow frame 233 may be optionally placed over periphery of the substrate 102 when processing to prevent deposition on the edge of the substrate 102. Lift pins 238 are moveably disposed through the substrate support assembly 230 and are adapted to space the substrate 102 from the substrate receiving surface 232. The substrate support assembly 230 may also include heating and/or cooling elements 239 utilized to maintain the substrate support assembly 230 at a desired temperature. The substrate support assembly 230 may also include grounding straps 231 to provide RF grounding around the periphery of the substrate support assembly 230. Examples of grounding straps are disclosed in U.S. Pat. No. 6,024,044 issued on Feb. 15, 2000 to Law et al., and U.S. patent application Ser. No. 11/613,934 filed on Dec. 20, 2006 to Park et al., which are both incorporated by reference in their entirety.

The gas distribution plate 210 is coupled to a lid 212 or walls 202 of the chamber 200 at its periphery by a suspension 214. The gas distribution plate 210 may also be coupled to the lid 212 by one or more center supports 216 to help prevent sag and/or control the straightness/curvature of the gas distribution plate 210. In one embodiment, the gas distribution plate 210 has different configurations with different dimensions. In an exemplary embodiment, the gas distribution plate 210 is a quadrilateral gas distribution plate. The gas distribution plate 210 has a downstream surface 250 having a plurality of apertures 211 formed therein facing an upper surface 218 of the substrate 102 disposed on the substrate support assembly 230. The apertures 211 may have different shape, numbers, densities, dimensions, and distributions across the gas distribution plate 210. In one embodiment, the diameter of the apertures 211 may be selected between about 0.01 inch and about 1 inch. Examples of gas distribution plates are disclosed in U.S. Pat. No. 6,477,980 issued on Nov. 12, 2002 to White et al., U.S. Publication No. 2005/0251990 published on Nov. 17, 2005 to Choi et al., and U.S. Publication No. 2006/0060138 published on Mar. 23, 2006 to Keller et al., which are all incorporated by reference in their entirety.

A gas source 220 is coupled to the lid 212 to provide gas through the lid 212, and then through the apertures 211 formed in the gas distribution plate 210 to the process volume 206. A vacuum pump 209 is coupled to the chamber 200 to maintain the gas in the process volume 206 at a desired pressure.

An RF power source 222 is coupled to the lid 212 and/or to the gas distribution plate 210 to provide a RF power that creates an electric field between the gas distribution plate 210 and the substrate support assembly 230 so that a plasma may be generated from the gases between the gas distribution plate 210 and the substrate support assembly 230. The RF power may be applied at various RF frequencies. For example, RF power may be applied at a frequency between about 0.3 MHz and about 200 MHz. In one embodiment the RF power is provided at a frequency of 13.56 MHz.

In one embodiment, the edges of the downstream surface 250 of the gas distribution plate 210 may be curved so that a spacing gradient is defined between the edge and corners of the plate 210 and substrate receiving surface 232 and, consequently, between the plate 210 and the surface 218 of the substrate 102. The shape of the curved surface 250 (e.g., convex, planar or concave) may be selected to meet specific process requirements. Therefore, the edge to corner spacing gradient may be utilized to tune the film property uniformity across the edge of the substrate, thereby correcting property non-uniformity in the corner of the substrate. Additionally, the edge to center spacing may also be controlled so that the film property distribution uniformity may be controlled between the edge and center of the substrate. In one embodiment, a concave curved edge of the gas distribution plate 210 may be used so the center portion of the edge of the gas distribution plate 210 is spaced farther from the substrate surface 218 than the corners of the plate 210. In another embodiment, a convex curved edge of the gas distribution plate 210 may be used so that the corners of the gas distribution plate 210 are spaced farther than the edges of the distribution plate 210 from the substrate surface 218.

A remote plasma source 224, such as an inductively coupled remote plasma source, may also be coupled between the gas source and the backing plate. Between processing substrates, a cleaning gas may be energized in the remote plasma source 224 to remotely provide plasma utilized to clean chamber components. The cleaning gas may be further excited by the RF power provided to the gas distribution plate 210 by the power source 222. Suitable cleaning gases include, but are not limited to, $NF_3$, $F_2$, and $SF_6$. Examples of remote plasma sources are disclosed in U.S. Pat. No. 5,788,778 issued Aug. 4, 1998 to Shang et al., which is incorporated by reference.

In one embodiment, the substrate 102 that may be processed in the chamber 200 may have a surface area of 10,000 $cm^2$ or more, such as 40,000 $cm^2$ or more, for example about 55,000 cm² or more. It is understood that after processing the substrate may be cut to form smaller other devices.

In one embodiment, the heating and/or cooling elements 239 may be set to provide a substrate support assembly temperature during deposition of about 400 degrees Celsius or less, for example between about 100 degrees Celsius and about 400 degrees Celsius, or between about 150 degrees Celsius and about 300 degrees Celsius, such as about 200 degrees Celsius.

The nominal spacing during deposition between the top surface 218 of the substrate 102 disposed on the substrate receiving surface 232 and the gas distribution plate 210 may generally vary between 400 mil and about 1,200 mil, such as between 400 mil and about 800 mil, or other distance across the gas distribution plate 210 to provide desired deposition results. In one exemplary embodiment for a concave downstream surface gas distribution plate 210 is utilized, the spacing between the center portion of the edge of the plate 210 and the substrate receiving surface 232 is between about 400 mils and about 1400 mils and the spacing between the corners of the plate 210 and the substrate receiving surface 232 is between about 300 mils and about 1200 mils.

Figure 3:
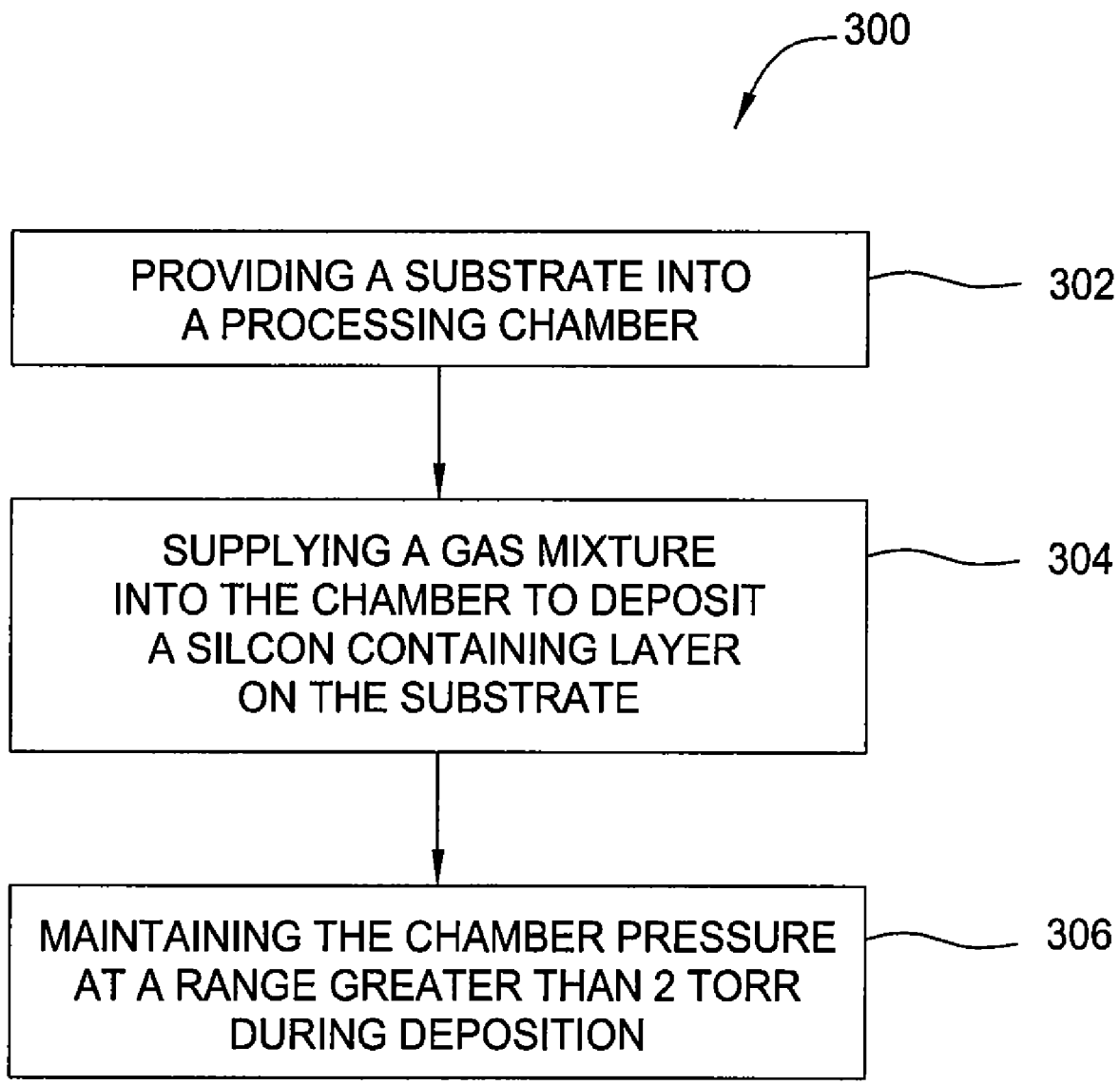
FIG. 3 depicts a process flow diagram of one embodiment of a method of forming microcrystalline silicon layer that may be used in a device structure.

FIG. 3 depicts a flow diagram of one embodiment of a deposition process 300 that may be practiced in the chamber 200, as described in FIG. 2, or other suitable processing chamber. The process 300 illustrates a method of depositing a microcrystalline silicon containing layer that may be used in TFT devices, or diode devices. In one embodiment, the microcrystalline silicon containing layer may be used to replace the conventional amorphous silicon layer in a TFT device or a diode. In another embodiment, the microcrystalline silicon containing layer may be used in combination with an amorphous silicon layer to form the device structure. In yet another embodiment, the microcrystalline silicon containing layer may be used, alone or in combination with, any other suitable films to improve electrical properties and performance in TFT or diode devices.

The process 300 begins at step 302 by providing the substrate 102 in a process chamber, such as the process chamber 200 depicted in FIG. 2. The substrate 102 may have the optional dielectric layer 104, the gate electrode 106 and the gate insulator layer 108 previously formed thereon. It is noted that the substrate 102 may have different combination of films, structures or layers previously formed thereon to facilitate forming different device structures on the substrate 102. In one embodiment, the substrate 102 may be any one of glass substrate, plastic substrate, polymer substrate, metal substrate, singled substrate, roll-to-roll substrate, or other suitable transparent substrate suitable for forming a thin film transistor thereon.

Figure 1:
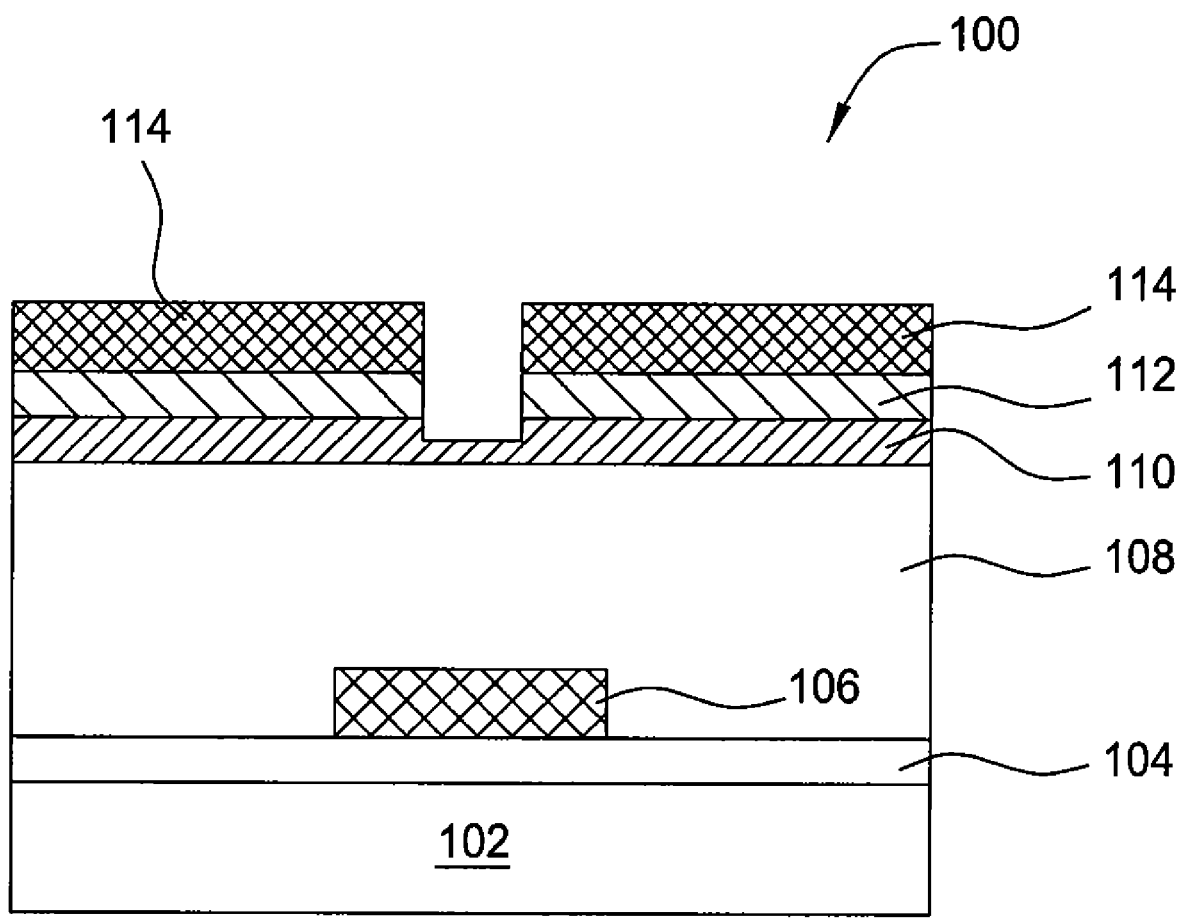
FIG. 1 is a sectional view of a conventional thin film transistor device structure.
Figure 4A:
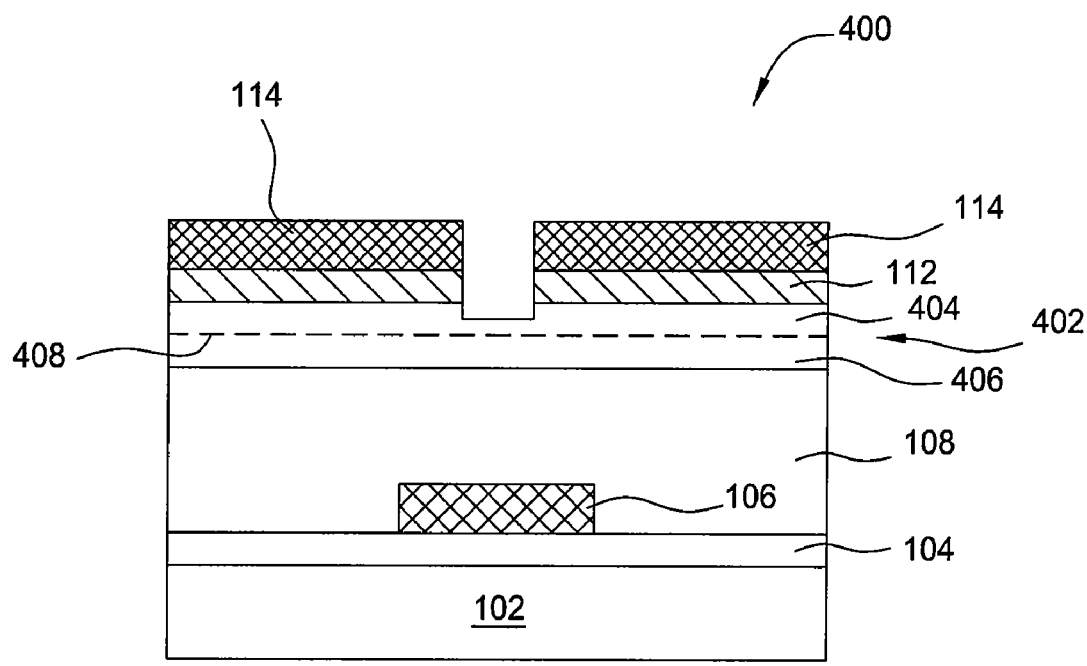
FIG. 4A-B depicts different embodiments of a device structure having a microcrystalline silicon layer formed in accordance with an embodiment of the present invention.

At step 304, a gas mixture is supplied into the processing chamber to deposit a microcrystalline silicon layer 402 on the substrate 102, as depicted in FIG. 4A. The microcrystalline silicon layer 402 may be formed on the gate insulator layer 108 in place of a conventional amorphous silicon layer, such as the amorphous silicon layer 110, as depicted in FIG. 1. Alternatively, the microcrystalline silicon layer 402 may be formed in the structure in different configurations, such as in combination with other silicon based layer, including polysilicon, amorphous silicon, or other suitable materials, to form the structure.

In one embodiment, the microcrystalline silicon layer 402 may be formed as a single layer deposited by a single process step. In another embodiment, the microcrystalline silicon layer 402 may have one or more layers formed using a multiple step deposition process. For example, the microcrystalline silicon layer 402 may be formed as a composite film having a first layer 406 and a second layer 404 divided by the dotted line 408, as depicted by FIG. 4A. In yet another embodiment, the deposition process may be divided into as many steps as needed to form the microcrystalline silicon layer 402 so that the microcrystalline silicon layer 402 has many layers as desired. After completion of the microcrystalline silicon layer deposition process, the n-type or p-type amorphous or microcrystalline silicon layer ($N^+/P^+$-a-Si or μc-Si) 112 and the source-drain metal electrode 114 may be then consecutively disposed thereover to form the device structure 400. In one embodiment, the microcrystalline silicon layer 402 may have a crystalline fraction greater than 60 percent.

During deposition of the microcrystalline silicon layer 402, the gas mixture may include a silicon-based gas and a hydrogen based gas. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. In one embodiment, the silicon-based gas described here is silane ($SiH_4$) gas. Suitable hydrogen-based gases include, but are not limited to, hydrogen gas ($H_2$).

In the embodiment wherein the microcrystalline silicon layer 402 is configured as a single layer, the deposition process is a single step process. In one embodiment of step 304, the silicon based gas is silane ($SiH_4$) and the hydrogen-based gas is hydrogen ($H_2$). The silane gas and the hydrogen gas are supplied at a predetermined gas flow ratio. The predetermined gas flow ratio of hydrogen to silane gas assists the microcrystalline silicon containing film formed with a desired crystalline fraction and grain structure. In one embodiment, the hydrogen to silane gas flow ratio (e.g., flow volume ratio) in the gas mixture is controlled at greater than 200:1, for example, greater than 500:1, such as between about 500:1 and about 3000:1, or between about 1000:1 and about 2500:1, such as about 2000:1. During deposition, plasma formed from the gas mixture dissociates the silane gas and the hydrogen gas into ions and radicals. Relatively high hydrogen dilution, such as greater than about 200:1, provides high number of atomic hydrogen from the hydrogen gas to react with the hydrogen radicals provided from the silane gas. The reaction of the hydrogen radicals with the atomic hydrogen drives out the weak and dangling bond of the silicon-hydrogen bonding or strained amorphous silicon-silicon bonding in the silicon film, thereby leaving silicon atoms in the film to form strong silicon-silicon bonding. Strong silicon and silicon bonding promotes purity and silicon bonding energy formed in the resultant film, thereby increasing the crystalline fraction and crystal structure formed in the microcrystalline film.

Furthermore, the high hydrogen dilution in the gas mixture along with a relatively high RF power, such as greater than about 200 milliWatt/cm², in the processing chamber assists dissociation of a high number of atomic hydrogen in the gas mixture, thereby providing a hydrogen rich surface which may prevent subsequently dissociated hydrogen radical from silane gas from being reattached into the silicon film. It is believed that higher hydrogen dilution in the gas mixture assist in increasing the crystalline fracture and crystal structure in the resultant silicon film.

In one embodiment wherein the substrate has a substrate size about 370 mm×470 mm, the $SiH_4$ gas may be supplied at a flow rate less than about 50 sccm, such as between about 1 sccm and about 20 sccm, into the processing chamber. $H_2$ gas may be supplied at a flow rate at between about 2000 sccm and about 100000 sccm, such as between about 2000 sccm and about 40000 sccm, into the processing chamber. An inert gas, such as Ar or helium gas, may be supplied in the gas mixture to assist carrying and diluting the gas species in the gas mixture. In one embodiment, the inert gas may be supplied in the gas mixture at a flow rate of less than about 3000 sccm, such as about 2000 sccm.

Several process parameters may be controlled during deposition process. RF power may be applied to maintain the plasma during deposition. In one embodiment, the RF power density may be supplied between about 200 milliWatt/cm$^2$ and about 800 milliWatt/cm$^2$. The RF power is provided between about 100 kHz and about 100 MHz, such as about 350 kHz or about 13.56 MHz. Alternatively, a VHF power may be utilized to provide a frequency up to between about 27 MHz and about 200 MHz. The spacing of the substrate to the gas distribution plate assembly may be controlled in accordance with the substrate dimension. In one embodiment, the processing spacing for a substrate greater than 1 square meters is controlled between about 400 mils and about 1200 mils, for example, between about 400 mils and about 850 mils, such as 580 mils. The substrate temperature may be controlled at between about 150 degrees Celsius and about 500 degrees Celsius, such as about 370 degrees Celsius.

At step 306, during deposition, the process pressure is maintained at greater than 2 Torr, such as greater than 2.5 Torr. It is believed that the high pressure, greater than 2.5 Torr, may assist creating a pressure depletion that forms columnar structure and increases crystalline fraction in the microcrystalline silicon containing film. With the increase of the deposition pressure, the crystalline fraction and the columnar structure formed in the resultant film increases accordingly. Furthermore, it is believed that silicon atoms dissociated under high pressure tends to be packed and arranged in crystal orientation plane (220) of the resultant film during deposition, thereby forming columnar structure in the microcrystalline silicon containing layer. In contrast, silicon atoms dissociated under low pressure tends to be packed and arranged in an orientation plane (111) of the resultant film, which provides a random, smooth, and/or amorphous-like structure in the microcrystalline silicon layer. Accordingly, by efficiently controlling process pressure of the deposition process, the crystalline fraction and the crystal structure (e.g., columnar structure or random structure) of the deposited film may be efficiently controlled. Accordingly, the high pressure maintained during the process, along with the high hydrogen dilution supplied in the gas mixture at step 304 assist forming a desired crystalline fraction and columnar structure in the microcrystalline silicon containing film.

In one embodiment, the deposition pressure is maintained between about 2.5 Torr and about 12 Torr, such as between about 2.8 Torr and about 9.5 Torr, for example between about 3 Torr and about 9 Torr. In the embodiment wherein the microcrystalline silicon layer 402 is formed as a single layer desired to have relatively high crystalline fraction, the process pressure may be maintained at a relatively high pressure, such as greater than 6 Torr, for example, about greater than 8 Torr, such as about 9 Torr. In the embodiment wherein the microcrystalline silicon layer 402 is formed as a single layer desired to have relatively low crystalline fraction, the process pressure may be maintained less than 5 Torr, for example about less than 4 Torr, for example between about 2.5 Torr and about 4 Torr, such about 3 Torr.

In one embodiment, when the microcrystalline silicon containing layer is utilized in a TFT device structure, a high crystalline fraction of the microcrystalline silicon containing layer provides high electron mobility, which improves the electrical performance of the device. However, high crystalline fraction of the microcrystalline silicon containing layer may have more grain boundaries where defects reside. Those defects may result in unwanted current leakage in device structure, thereby adversely affecting device performance. Accordingly, in some embodiments, one or more layers of microcrystalline silicon containing layer having different crystalline fraction and grain structure in each layer may be stacked to maintain the overall microcrystalline silicon containing film to both have a desired electron mobility and low current leakage.

In the embodiment wherein the deposition process has multiple steps to form the microcrystalline silicon layer 402 as multiple layers, such as the first layer 406 and the second layer 404, the deposition pressure and the gas mixture supplied may be controlled differently in each step to produce different film properties. For example, in the embodiment wherein the deposited layer is desired to have a relatively high crystalline fraction and columnar structure to maintain high electron mobility, a higher pressure may be maintained during deposition. In contrast, in the embodiment wherein the deposited layer is desired to have a relatively lower crystalline fraction and random structure to have low current leakage, a lower pressure may be maintained during deposition. The gas mixtures supplied and RF power applied may be varied as well to meet different film property requirements.

In one embodiment, the first layer 406 is configured to have a relatively high crystalline fraction, such as greater than about 70 percent, to provide high electron mobility to the device while the second layer 404 is configured to have a relatively lower crystalline fraction compared to the crystalline fraction of the first layer 406, greater than about 60 percent. In one embodiment, the second layer 404 has a crystalline fraction less than the first layer 406 to provide a low film current leakage. Additionally, the first layer 406 is desired to have a more columnar grain structure formed within the layer 406 while the second layer 404 is desired to have a more random, and/or amorphous silicon-like structure formed in the second layer 404. In this particular embodiment, the process pressure of the deposition process may be initially controlled at a first high pressure, such as about greater than 8 Torr, during a first deposition step and then transited to a second lower pressure, such as less than about 4 Torr, during at a second deposition step. The transition from the high pressure to the low pressure results in the deposited film having a high crystalline fraction and more columnar grain structure in the first layer 406 and a low crystalline fraction and more random grain structure of the second layer 404. Alternatively, the pressure and the gas mixture may be controlled in a manner during the different steps of the deposition process to produce the films having different crystalline fraction and grain structure across different portions of the thickness of the deposited film. In one embodiment, the first layer 406 may have a thickness between about 200 Å and about 2000 Å and have a crystalline fraction of about 75 percent to 100 percent. The second layer 404 may have a thickness between about 200 Å and about 2000 Å and having a crystalline fraction of about 65 percent to 100 percent.

In certain embodiments, a first deposition step for the first layer 406 of the microcrystalline silicon containing layer deposition process is configured to have a first process pressure greater than about 6 Torr, for example greater than about 8 Torr, such as about 9 Torr, a gas mixture having a hydrogen to silane gas ratio about 2000:1, and a RF power about 520 milliWatt/cm$^2$ to maintain a plasma formed from the first gas mixture. An inert gas, such as an Ar gas, is also supplied to the gas mixture to assist carrying the gas into the processing chamber. When the first layer 406 has deposited to a desired thickness, such as between about 200 Å and about 2000 Å, the process pressure may be gradually changed to a second process pressure less of than about 5 Torr, for example about less than 4 Torr, such as about 3 Torr, to deposit the second layer 404. The first process pressure greater than about 8 Torr during the first deposition step is smoothly transited to the second process pressure less at the second deposition step. The gas mixture and gas ratio supplied in the first step and the second step may be the same or varied. In one specific example, the first gas mixture supplied in the first step includes $SiH_4$, $H_2$ and Ar, and the second gas mixture supplied in the second step switches to $SiH_4$ and $H_2$. The gas ratio of $H_2$ to $SiH_4$ remains substantially the same in each step, such as about 2000:1. Alternatively, the gas ratio and the RF power may remain the same or be varied in accordance different configurations of the film properties. In one embodiment, the RF power density is supplied between about 200 milliWatt/$cm^2$ and about 800 milliWatt/$cm^2$ in the first gas mixture and the RF power density is supplied between about 300 milliWatt/$cm^2$ and about 700 milliWatt/$cm^2$ in the second gas mixture.

Figure 4B:
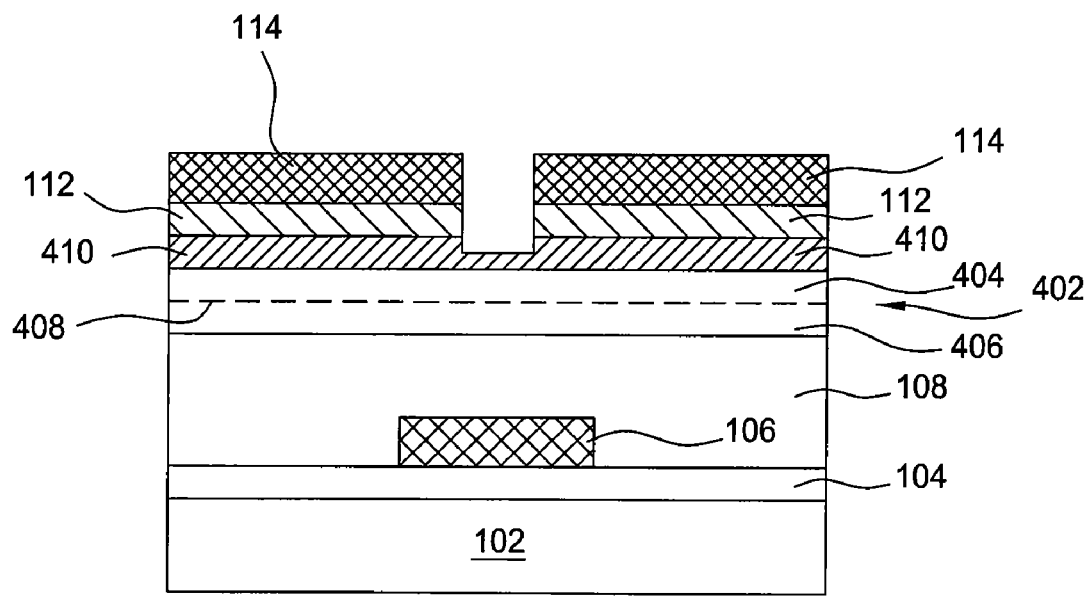

In yet another embodiment, after formation of the first layer 406 and the second layer 404 of the microcrystalline silicon containing layer 402, an optional capping layer 410 may be formed over the microcrystalline silicon containing layer 402, as shown in FIG. 4B. The capping layer 410 is selected from any silicon containing layer that may assist improving current leakage control and device performance. For example and as discussed above, high crystalline fraction improves electron mobility of the microcrystalline silicon containing layer 402 but may result in higher number of grain boundaries in the film which may cause unwanted current leakage. Additionally, as the deposition rate of the microcrystalline silicon containing layer 402 is often relatively slower than other non-crystalline silicon layer, the optional capping layer 410 may be formed in a manner having a higher deposition rate to improve overall process throughput. Accordingly, the optional capping layer 410 may be deposited to improve manufacture throughput while maintaining the overall device structure having a desired electrical performance.

In one embodiment, the optional capping layer 410 is an amorphous silicon layer. In one embodiment, the amorphous silicon layer may be deposited by supplying a gas mixture having a hydrogen to silane ratio between about 1 and about 20. In one embodiment, the $SiH_4$ gas may be supplied at a flow rate at between about 50 sccm and about 500 sccm into the processing chamber. The $H_2$ gas may be supplied at a flow rate at between about 50 sccm and about 1000 sccm into the processing chamber. An inert gas, such as Ar or helium gas, may be supplied into the gas mixture to assist carrying and diluting the gas species in the gas mixture. In one embodiment, the inert gas may be supplied in the gas mixture at a flow rate less than about 2000 sccm. The process pressure may be maintained at between about 1 Torr and 5 Torr. RF power density may be maintained between about 50 milliWatt/$cm^2$ and about 300 milliWatt/$cm^2$. The processing spacing for a substrate greater than 1 square meters is controlled between about 400 mils and about 1200 mils, for example, between about 450 mils and about 1500 mils. The substrate temperature may be controlled at between about 200 degrees Celsius and about 400 degrees Celsius. The amorphous silicon layer may be deposited by other suitable manners, including those from conventional techniques.

It is noted that the optional capping layer 410 may be integratedly deposited in the same chamber in which the microcrystalline silicon containing layer 402 was formed. Alternatively, the optional capping layer 410 may be deposited in a separate chamber if desired.

After deposition of the microcrystalline silicon containing layer 402 and the optional capping layer 410, the n-type or p-type amorphous or microcrystalline silicon layer ($N^+/P^+$-a-Si or μc-Si) 112 and the source-drain metal electrode 114 may be then consecutively disposed thereover to form the device structure 400.

In the embodiment wherein the microcrystalline silicon deposition process have multiple steps, after deposition of the first layer 406, second layer 406, optional capping layer 410 and the n-type or p-type amorphous or microcrystalline silicon layer ($N^+/P^+$-a-Si or μc-Si) 112, the film stack may be etched or patterned to form features and/or trenches therein to form a desired device structure, as shown in FIGS. 4A-B.

Figure 5:
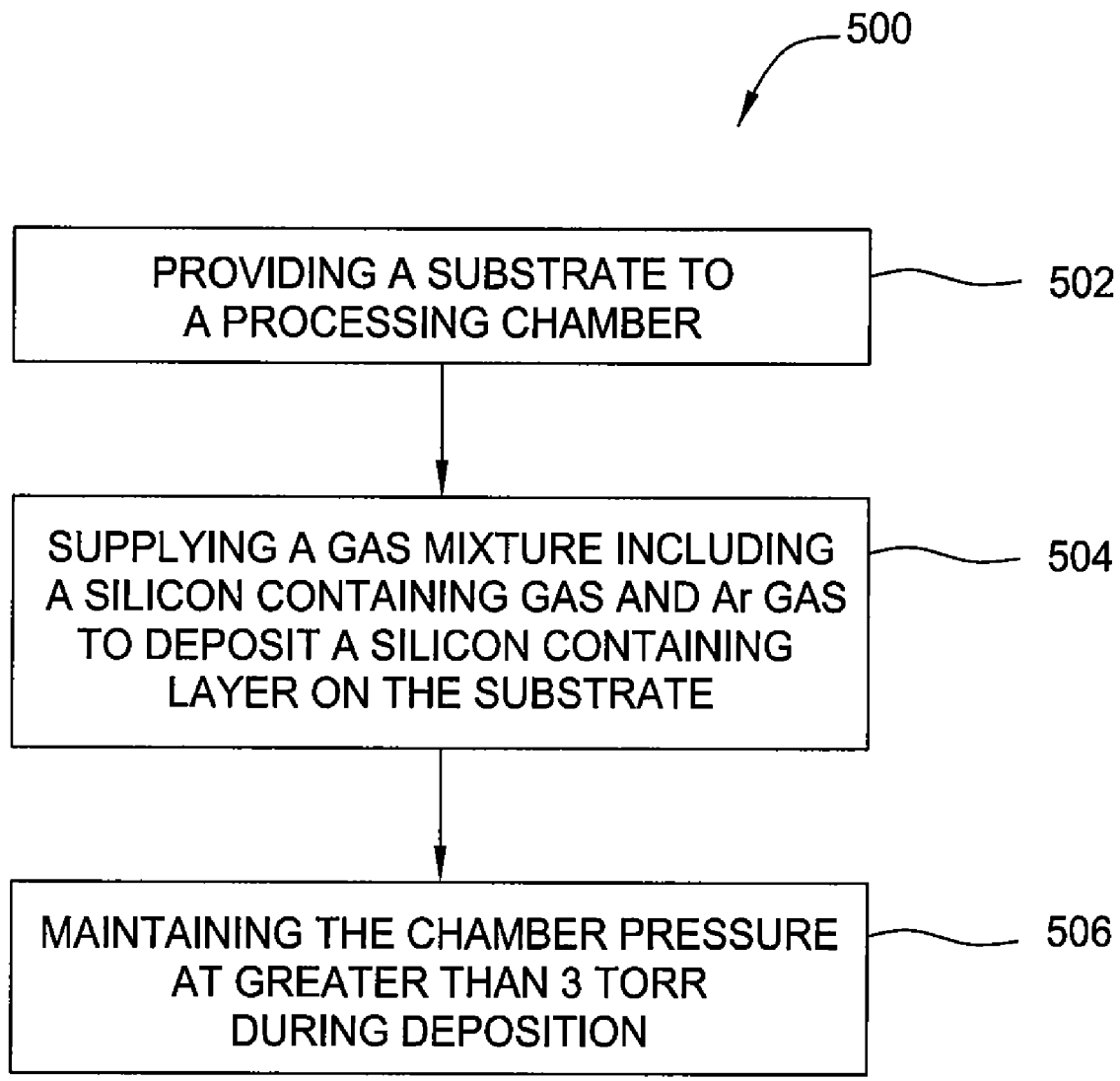
FIG. 5 depicts a process flow diagram of another embodiment of a method for forming microcrystalline silicon layer that may be used in a device structure.

FIG. 5 depicts a flow diagram of another embodiment of a deposition process 500 for forming a microcrystalline silicon layer, such as the microcrystalline silicon layer 402 depicted in FIGS. 4A-B. The deposition process is similar to the deposition process 300 depicted in FIG. 3, except the gas mixture supplied and process parameters controlled during deposition are different.

The process 500 begins at step 502 by providing the substrate 102 in a process chamber, such as the process chamber 200 depicted in FIG. 2. As discussed above, the substrate 102 may have the optional dielectric layer 104, the gate electrode 106 and the gate insulator layer 108 previously formed thereon. At step 504, a gas mixture containing a silicon-based gas, a hydrogen-based gas and Ar gas is supplied into the processing chamber to deposit a microcrystalline silicon layer, such as the microcrystalline silicon layer 402 depicted in FIGS. 4A-B, on the substrate 102. As discussed above, the microcrystalline silicon layer 402 may be formed as a single layer, or as one or more layers using single or multiple step deposition process as needed.

In one embodiment, the silicon-based gas supplied in the gas mixture may be selected from a group consisting of silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. In one embodiment, the silicon-based gas described here is silane ($SiH_4$) gas. Suitable hydrogen-based gases include, but are not limited to, hydrogen gas ($H_2$). In one embodiment, the silicon-based gas and the hydrogen-based gas are supplied into the processing chamber at a predetermined ratio to deposit the microcrystalline silicon layer with a desired crystalline fraction, such as greater than 60 percent. In one embodiment, the ratio (R) of the hydrogen-based gas to the silicon-based gas ($H_2/SiH_4$) is controlled about greater than 100, for example greater than 200, such as between about 500 and about 3000, for example about between about 1000 and 2500, such as about 2000. Alternatively, the silicon-based gas and hydrogen-based gas supplied into the processing chamber may be supplied by volumetric flow rate. In one embodiment wherein the substrate has a substrate size about 370 mm×470 mm, the $SiH_4$ gas may be supplied at a flow rate less than about 50 sccm, such as between about 1 sccm and about 20 sccm, into the processing chamber. $H_2$ gas may be supplied at a flow rate at between about 2000 sccm and about 100000 sccm, such as between about 2000 sccm and about 40000 sccm, into the processing chamber.

By controlling the ratio (R) of the hydrogen containing gas to the silicon containing gas ($H_2/SiH_4$) at a desired range, the crystalline fraction formed in the resultant silicon film may be controlled. Additionally, as discussed above, since hydrogen atoms may drive out undesired week dangling bonds and impurities in the silicon layer, an incubation layer, e.g., an interfacial layer made from loose amorphous silicon atoms often found in conventional practice, is eliminated. Elimination of the incubation layer may significantly improve interface strength and film adhesion, thereby efficiently improving electrical properties and resistivity of the device structure.

The flow of Ar gas ($G_{Ar}$) supplied into the processing chamber may be controlled to a predetermined ratio to the total combined gas flow of $H_2$ and $SiH_4$ gas flow ($T_C$) supplied in the gas mixture. In one embodiment, the ratio of the Ar gas flow ($G_{Ar}$) to the total gas flow ($T_C$) of $H_2$ and $SiH_4$ supplied in the gas mixture is controlled to between about 5 percent and about 40 percent by volume (e.g., $G_{Ar}/T_C$ value between about 5 percent and about 40 percent by volume). For example, in an embodiment wherein the Ar gas flow is supplied at about 1200 sccm, the total combined gas flow of $H_2$ and $SiH_4$ may be between about 3000 sccm and about 24000 sccm. In one embodiment, the ratio of Ar gas flow ($G_{Ar}$) to the total gas flow ($T_C$) of $H_2$ and $SiH_4$ (e.g., $G_{Ar}/T_C$ value) is controlled between about 5 percent and about 40 percent by volume, such as between about 10 percent and about 30 percent by volume, for example about 20 percent by volume. Alternatively, the Ar gas supplied in the gas mixture may be controlled by flow rate by volume. In one embodiment, the Ar gas flow is controlled at about less than 10000 sccm, such as less than 6000 sccm, for example about 500 sccm and about 3000 sccm, such as about 1200 sccm or 2000 sccm.

It is believed that the Ar gas supplied in the gas mixture performs a similar function as the hydrogen gas supplied in the gas mixture. As argon atoms has a relatively higher molecular weight than silicon and hydrogen atoms, when supplying into the gas mixture during processing, the argon atoms in the gas mixture may assist driving out the weak and dangling bonds of the silicon-hydrogen and/or amorphous silicon-silicon bonding in the silicon layer, thereby allowing the silicon atoms in the silicon layer to form strong silicon to silicon bonds. As discussed above, strong silicon to silicon bonding promotes film purity and high silicon bonding energy, thereby increasing the crystalline fraction and crystal structure formed in the microcrystalline film.

Additionally, by supplying Ar gas in the gas mixture, a uniform columnar structure may be obtained in the resultant microcrystalline silicon layer. As the Ar atoms assist forming a strong and robust silicon bonding and drive out impurities, not only are defects in the silicon layer reduced, but also uniform and repeated columnar structures may be formed in the silicon film so that the undesired random grain boundary and grain boundary defects may be reduced. Accordingly, a high mobility, high activation energy and low sub-threshold swing (S) of the resultant microcrystalline silicon layer may be obtained.

Several process parameters may be controlled during deposition process. RF power may be applied to maintain the plasma during deposition. In one embodiment, the RF power density may be supplied between about 200 milliWatt/cm$^2$ and about 800 milliWatt/cm$^2$, such as between about 500 milliWatt/cm$^2$. The RF power is provided between about 100 kHz and about 100 MHz, such as about 350 kHz or about 13.56 MHz. Alternatively, a VHF power may be utilized to provide a frequency up to between about 27 MHz and about 200 MHz. The spacing of the substrate to the gas distribution plate assembly may be controlled in accordance with the substrate dimension. In one embodiment, the processing spacing for a substrate greater than 1 square meters is controlled between about 400 mils and about 1200 mils, for example, between about 400 mils and about 850 mils, such as 580 mils. The substrate temperature may be controlled at between about 150 degrees Celsius and about 500 degrees Celsius, such as about 370 degrees Celsius.

At step 506, during deposition, the process pressure is maintained at a high pressure range, such as greater than 3 Torr, for example, greater than 6 Torr. As discussed above, it is believed that the high pressure may assist in creating a pressure depletion that assists the formation of columnar structures and increases crystalline fraction in the deposited microcrystalline silicon film 402. Additionally, high pressure also assists packing silicon atoms in crystal orientation plane (220), rather than the orientation plane (111), thereby increasing columnar structures and reducing the presence of random, smooth, and amorphous-like structures in the resultant microcrystalline silicon film 402. Accordingly, by efficiently controlling the depositing pressure at greater than 3 Torr, a high ratio of atoms having crystal orientation in relative plane (220) to orientation plane (111) may be obtained which also results in more columnar structures formed in the film, thereby increasing crystalline fraction of the film. As the crystalline fraction of the microcrystalline silicon film 402 increases, a high photo/dark conductivity ratio may be obtained and the overall electrical properties of the microcrystalline silicon film 402 may be improved.

In one embodiment, the process pressure during deposition of the microcrystalline silicon film 402 is controlled at greater than 3 Torr, such as greater than 6 Torr, such as greater than 8 Torr, for example about 9 Torr.

Similar to the structure discussed above, after formation of the microcrystalline silicon layer 402 fabricated by the process 500, a capping layer may be deposited on the microcrystalline silicon layer 402.

It is noted that the process 500 may be performed to form the microcrystalline silicon layer 402 as a single layer or as multiple layers. In one embodiment wherein one or more layers comprises the microcrystalline silicon layer 402, the process 500 may be used to form the first layer 406 of the microcrystalline silicon layer 402, similar to as depicted in FIGS. 4A-B. The second layer 404 may be formed by the process 500 described above, or by a low pressure process such as the process 300 depicted with reference to FIG. 3. Alternatively, the process 500 may be utilized to form either the first layer 406 or and second layer 404 in any order or in any manner as needed.

EXAMPLES

The following examples are exemplary in nature and are not meant to limit the scope claims unless specifically set forth in the claims.

Example 1

The table below shows the effects of using different $H_2/SiH_4$ ratio (R) while depositing the microcrystalline silicon layer.

| μc-Si film | Ioff A | Ion A | μ cm2/Vsec | S V/dec | Ic/Ia | Ph/D | Ea eV | incubation A |
|---|---|---|---|---|---|---|---|---|
| 200R | 6.6E−12 | 2.9E−07 | 0.07 | 1.24 | 1.98 | 1.0 | 0.09 | High |
| 400R | 1.6E−10 | 3.7E−07 | 0.06 | 4.02 | 3.54 | 2.5 | 0.20 | 440 |
| 600R | 3.1E−09 | 8.0E−07 | 0.08 | 6.35 | 3.65 | 11.5 | 0.60 | 290 |
| 1000R | 8.7E−09 | 2.5E−06 | 0.25 | 5.70 | 3.69 | 43.7 | 0.70 | 160 |
| 2000R | 7.6E−09 | 4.1E−06 | 0.37 | 5.16 | 5.17 | 46.3 | 0.67 | 0 |

The first experimental data of 200R represents using a $H_2/SiH_4$ ratio of about 200. Similarly, the second, third, fourth and fifth of the experimental data utilizes $H_2/SiH_4$ ratio of about 400, 600, 1000 and 2000 respectively. As the R ratio increase, the crystalline fraction (Ic/Ia) value of the microcrystalline silicon layer increases. Furthermore, the thickness of the incubation layer is reduced as well with the increase of the R ratio. Additionally, Ea (activation energy) and the Ph/D (Photoconductivity/Dark conductivity) also increase with the increase of the R ratio, thereby indicating the resultant microcrystalline silicon layer has less defects formed therein.

Example 2

Additionally, TEM (Transmission Electron Microscopy) data also indicates that with the increase of the ratio R of $H_2/SiH_4$, the incubation layer formed at the substrate interface decreases. As discussed above, higher R ratio may assist depositing microcrystalline silicon layer with higher crystalline fraction. By utilizing the high ratio R of $H_2/SiH_4$, the thickness of incubation layer, which is typically made from amorphous silicon at the beginning of the deposition process, may be efficiently reduced as amorphous silicon atoms are longer present in the beginning of the deposition process.

Example 3

Additionally, the drain current versus gate voltage curve (Ids-Vg curve) measurement also indicates that with the increase of the ratio R, a higher On-current and Off-current may be obtained.

Example 4

The table below shows the effects of supplying argon gas in the gas mixture while depositing the microcrystalline silicon layer.

| μc-Si film | Ioff A | Ion A | μ cm2/Vsec | S V/dec | Ic/Ia | Ph/D | Ea eV |
|---|---|---|---|---|---|---|---|
| Without Ar | 7.6E−09 | 4.1E−06 | 0.37 | 5.16 | 1.40 | 46.3 | 0.67 |
| With Ar | 9.4E−09 | 6.5E−06 | 0.88 | 3.69 | 1.52 | 60.1 | 0.99 |

Similar to the high R of $H_2/SiH_4$ discussed above, when supplying Ar in the gas mixture, the crystalline fraction (Ic/Ia) value of the microcrystalline silicon layer increases. Furthermore, the thickness of the incubation layer is reduced while supplying argon gas in the gas mixture. Additionally, Ea (activation energy) and the Ph/D (Photoconductivity/Dark conductivity) also increase, thereby indicating the resultant microcrystalline silicon layer has less defects formed therein.

Example 5

Additionally, according to the TEM image, when supplying Ar in the gas mixture during deposition, the resultant microcrystalline silicon layer can have more columnar structures formed within the film. Furthermore, the configuration and topography of the columnar structures are more uniform across the microcrystalline silicon layer.

Example 6

The drain current versus gate voltage curve (Ids-Vg curve) measurement also indicates that the microcrystalline silicon layer deposited with argon supplied in the gas mixture has higher electron mobility (0.88 cm2/Vs) than microcrystalline silicon layer deposited without Ar (0.37 cm2/Vs) due to higher On-current and lower interface defect density (lower S-value).

Example 7

Additionally, the Off-current is also improved by forming the microcrystalline silicon layer with high R and argon supply. With the combination of As gas supply and high R in the gas mixture, a film having mobility of about 1.15 cm2/Vs, sub-threshold swing (S) of about 1.14 V/dec and Off-current of about 5.5E-11 A may be obtained Example 8

Additionally, a thermal and electrical stability measurement (BTS test) is performed to evaluate the film stability. The BTS measurement was performed under 80 degrees Celsius with 40 Vg for positive BTS and −40 Vg for negative BTS for up to about 7000 seconds. The BTS data indicates that when supplying positive gate-bias, the threshold voltage shift of the microcrystalline silicon layer TFT is only about 3 V while comparatively, a conventional a-Si TFT is about 15V. In contrast, under negative gate-bias, the threshold voltage shift of the microcrystalline silicon layer TFT becomes stable at about −5V, while comparatively, a conventional a-Si TFT is about −7V. Accordingly, by utilizing high R and argon gas in the gas mixture during deposition, a robust and higher electrical quality microcrystalline silicon layer may be obtained.

Thus, the methods described herein advantageously improve the electron mobility, stability and uniformity of electric devices by controlling the film properties of the semiconductor layer, such as a microcrystalline silicon containing layer and an optional capping layer, formed in the device structure.

While the foregoing is directed to embodiments of the present invention, other and further embodiments of the invention may be devised without departing from the basic scope thereof, and the scope thereof is determined by the claims that follow.

The invention claimed is:

1. A method for forming a microcrystalline silicon containing layer on a substrate comprising:
   providing a substrate in a processing chamber;
   supplying a gas mixture having a hydrogen-based gas, a silicon-based gas and an argon gas into the processing chamber, the gas mixture having a volumetric flow ratio of the hydrogen-based gas to the silicon-based gas between about 500:1 and about 3000:1, wherein a volumetric flow ratio of the argon gas to the total combined flow of hydrogen-based gas and the silicon-based gas is between about 5 percent and about 40 percent; and
   maintaining a process pressure of the gas mixture within the processing chamber at greater than about 3 Torr while depositing a microcrystalline silicon layer on the substrate.

2. The method of claim 1, wherein maintaining the process pressure further comprises:
   maintaining the process pressure at greater than 8 Torr.

3. The method of claim 1, wherein the silicon containing gas is $SiH_4$ and the hydrogen containing gas is $H_2$.

4. The method of claim 1, wherein supplying the gas mixture further comprises:
   supplying the Ar gas at a flow rate between about 500 sccm and about 3000 sccm.

5. The method of claim 1, further comprising:
   applying a RF power between about 200 milliWatt/$cm^2$ and about 800 milliWatt/$cm^2$ to maintain a plasma formed from the gas mixture.

6. The method of claim 1, wherein the deposited microcrystalline silicon layer on the substrate having a crystalline fraction about greater than 60 percent.

7. The method of claim 6 further comprising:
   forming a capping layer on the microcrystalline silicon layer.

8. The method of claim 7, wherein the capping layer is an amorphous silicon layer.

9. A method for forming a microcrystalline silicon containing layer on a substrate comprising:
   providing a substrate in a processing chamber;
   supplying a gas mixture having a $H_2$ gas, a $SiH_4$ gas and an Ar gas into the processing chamber, wherein the $H_2$ gas to $SiH_4$ gas having a volumetric flow ratio of between about 500:1 and about 3000:1, wherein volumetric flow ratio of the argon gas to the total combined flow of $H_2$ gas and the $SiH_4$ gas is between about 5 percent and about 40 percent; and
   maintaining a process pressure of the gas mixture within the processing chamber at greater than about 3 Torr while depositing a microcrystalline silicon layer.

10. The method of claim 9, wherein maintaining the process pressure further comprises:
    maintaining the process pressure of greater than 8 Torr.

11. The method of claim 9, wherein the $H_2$ to a $SiH_4$ gas volumetric film ratio in the gas mixture is between about 1000 and about 2500.

12. The method of claim 9, wherein the volumetric flow ratio of Ar gas to the total combined gas flow of $H_2$ gas and $SiH_4$ is between about 10 percent and about 30 percent by volume.

13. The method of claim 9, wherein the deposited microcrystalline silicon layer has a columnar structure.

14. The method of claim 13 further comprising:
    forming a capping layer on the microcrystalline silicon layer.

15. The method of claim 14, wherein the capping layer is an amorphous silicon layer.

16. A thin film transistor structure, comprising:
    a gate insulator layer disposed on a substrate;
    a microcrystalline silicon layer disposed over the gate insulator layer, wherein the microcrystalline silicon layer is formed by supplying a gas mixture comprising a $H_2$ gas, $SiH_4$ gas and an argon gas, wherein the $H_2$ gas to $SiH_4$ gas in the gas mixture has a volumetric flow ratio of between about 500:1 and about 3000:1 and a volumetric flow ratio of the Ar gas to the total combined flow of $H_2$ gas and the $SiH_4$ gas is controlled at between about 5 percent and about 40 percent; and
    a doped semiconductor amorphous silicon layer disposed over the microcrystalline silicon layer.

17. The structure of claim 16, wherein the $H_2$ gas to $SiH_4$ gas volumetric flow ratio in the gas mixture is between about 1000 and about 2500.

18. The structure of claim 16, further comprising:
    a capping layer disposed between the microcrystalline silicon layer and the doped semiconductor amorphous silicon layer.

19. The structure of claim 18, wherein the microcrystalline silicon layer is formed by maintaining a process pressure at greater than 6 Torr while supplying the gas mixture.

20. The structure of claim 18, wherein the microcrystalline silicon layer has a crystal fraction greater than 60 percent such that the threshold voltage shift of the structure becomes stable at about 3 V when under positive gate-bias and the threshold voltage shift of the structure becomes stable at about −5 V when under negative gate-bias.

* * * * *